United States Patent
Wang

(10) Patent No.: US 6,710,373 B2
(45) Date of Patent: Mar. 23, 2004

(54) MEANS FOR MOUNTING PHOTOELECTRIC SENSING ELEMENTS, LIGHT EMITTING DIODES, OR THE LIKE

(76) Inventor: Shih-Yi Wang, 30, Chung Mei St., Taichung (TW)

(*) Notice: Subject to any disclaimer, the term of this patent is extended or adjusted under 35 U.S.C. 154(b) by 0 days.

(21) Appl. No.: 10/201,768

(22) Filed: Jul. 22, 2002

(65) Prior Publication Data

US 2002/0175333 A1 Nov. 28, 2002

Related U.S. Application Data

(63) Continuation-in-part of application No. 09/405,072, filed on Sep. 27, 1999, now abandoned.
(51) Int. Cl.[7] .................... H01L 23/02; H01L 33/00; H01L 31/23
(52) U.S. Cl. .................. 257/79; 257/80; 257/81; 257/98; 257/100; 257/676; 257/677; 257/678
(58) Field of Search ............................ 257/79–81, 88, 257/89, 91, 95, 99–101, 431, 433, 668, 98, 676, 692, 696–698; 313/498, 503, 512

(56) References Cited

U.S. PATENT DOCUMENTS 6,521,916 B2 * 2/2003 Roberts et al. ............ 257/100

OTHER PUBLICATIONS

Hewlett–Packard, Inc., "Super Flux LEDs," Technical Data, Copyright 1998.*

John K. Roberts (Gentex Coroportion), "Binary Complementary Synthetic–White LED Illuminators, " SAE Technical Papers Series, International Congress and Exposition, Detroit, Michigan Mar. 1–4, 1999, pp. 1–17.*

* cited by examiner

Primary Examiner—Minhloan Tran
Assistant Examiner—Thomas L Dickey
(74) Attorney, Agent, or Firm—Raymond Y. Chan; David and Raymond Patent Group

(57) ABSTRACT

A photoelectric structure for surface mounting on a circuit board having a plurality of insertion holes includes at least a pair of fixation pins integrally extended downwards from a periphery of the mounting photoelectric element, and a pair of bended connections integrally extended downwards from a periphery of the mounting photoelectric element such that they are connected with the circuit board by welding, so as to facilitate the other pair of fixation pins to be inserted into the insertion holes of the circuit board for locating securely the photoelectric element for use in Surface Mount Device, SMD, and for enhancing effectively the position of the detection point as well as the degree of precision of the light emitting signal.

1 Claim, 4 Drawing Sheets

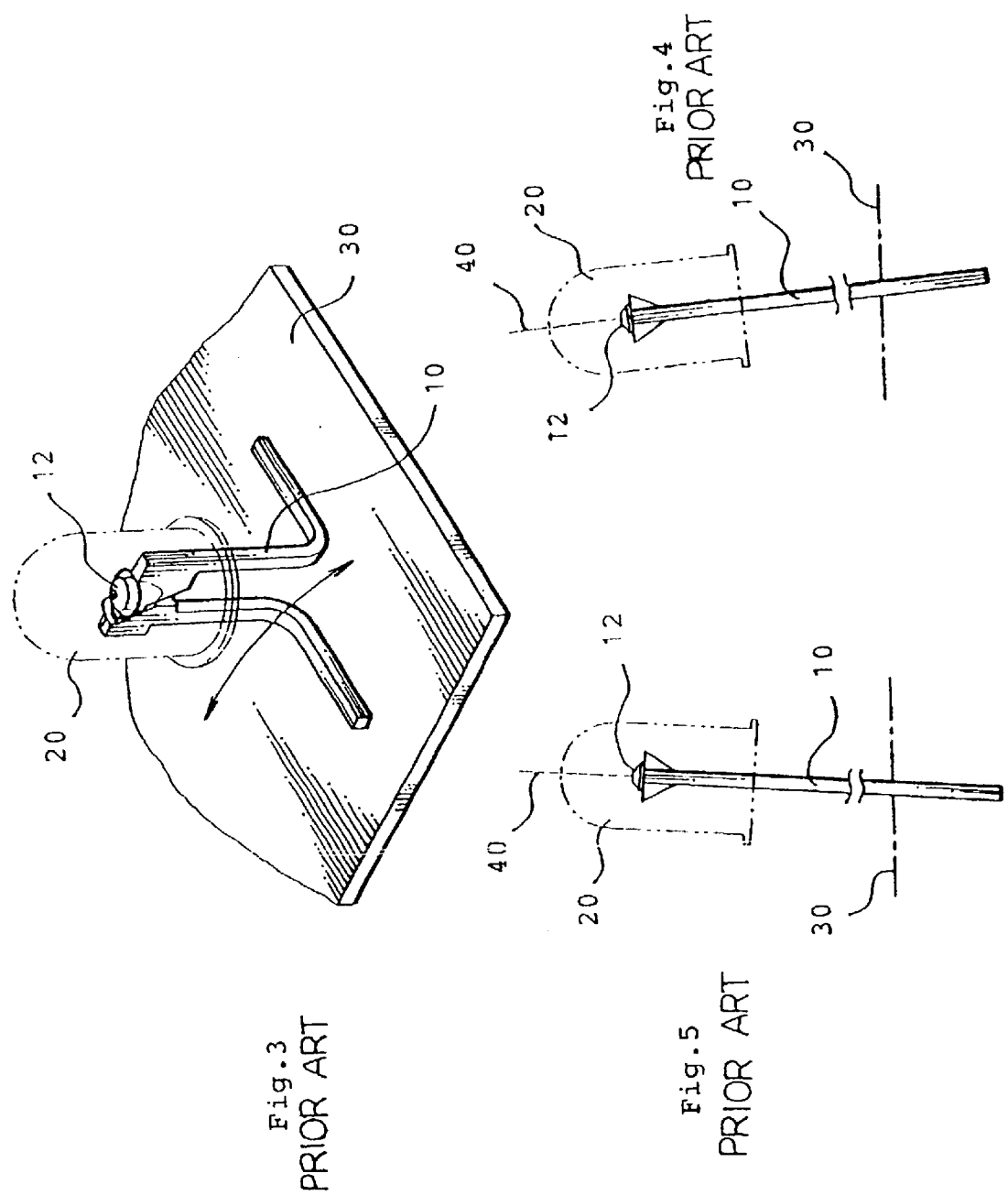

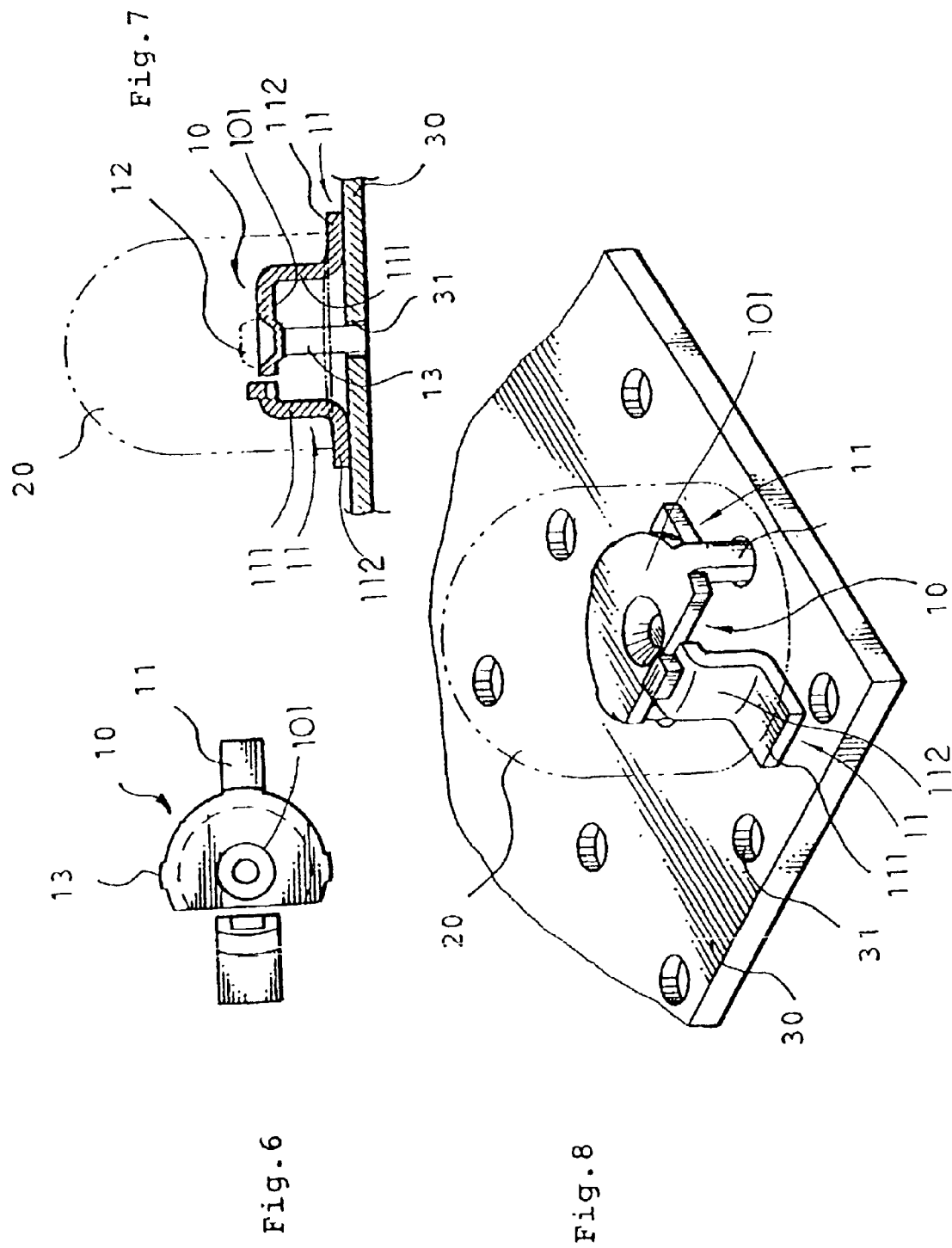

MEANS FOR MOUNTING PHOTOELECTRIC SENSING ELEMENTS, LIGHT EMITTING DIODES, OR THE LIKE

CROSS REFERENCE OF RELATED APPLICATION

This is a Continuation-In-Part application of a non-provisional utility application, application Ser. No. 09/405,072, filed Sep. 27, 1999 now abandoned.

BACKGROUND OF THE PRESENT INVENTION

1. Field of Invention

The present invention relates to photoelectric sensing elements, light emitting diodes, or the like, and more particularly to means for surface mounting photoelectric sensing elements, light emitting diodes, or the like for use in Surface Mount Device, SMD.

2. Description of Related Arts

As shown in FIGS. 1 and 2, the conventional photoelectric sensing element that is capable of emitting light signal comprises a main body 10 having a conductive lower end and an upper end which is fixed with a chip 12, and a housing 20 formed by injection molding or pattern molding. The lower end of the main body 10 is fastened with the circuit board by welding such that the main body 10 is connected with other circuit elements for bringing about the detection action. This is the so-called DIP assembly mode.

Such a conventional photoelectric element as described above has drawbacks which are described hereinafter.

A pair of connection pins of the lower end of the main body take up two much space. As a result, the conventional photoelectric element can not be used in the SMD assembly mode that calls for a relatively small space. If the conventional photoelectric element is used in the SMD assembly mode, the connections must be bent before being welded to the circuit board. Such a practice often results in the inclination phenomenon towards the direction as indicated by the arrow in FIG. 3.

When the photoelectric element is fastened with the circuit board, the gaps are often formed in light of the insertion holes, which are slightly greater than the diameter of the connections, resulting in the inclination phenomenon as shown in FIGS. 4 and 5. Therefore, the welding job can not be brought about with precision. The direction 40 of the light signal is thus bound to deviate and tilted.

In order to make the main body integrally, the material thickness must be so confined that the main body is very thin. As a result, the area for mounting the chip is rather limited. The chip size must be therefore taken into consideration at the expense of the light signal intensity.

SUMMARY OF THE PRESENT INVENTION

The primary objective of the present invention is to provide means for surface mounting photoelectric sensing elements, light emitting diodes, or the like, which comprises at least a pair of fixation pins integrally extended downwards from a periphery of the mounting photoelectric element, and a pair of bended connections integrally extended downwards from a periphery of the mounting photoelectric element such that they are connected with the circuit board by welding, so as to facilitate the other pair of fixation pins to be inserted into the insertion holes of the circuit board for locating securely the photoelectric element for use in Surface Mount Device, SMD, and for enhancing effectively the position of the detection point as well as the degree of precision of the light emitting signal.

These and other objectives, features, and advantages of the present invention will become apparent from the following detailed description, the accompanying drawings, and the appended claims.

BRIEF DESCRIPTION OF THE DRAWINGS

FIG. 3 illustrates a side view of the prior art photoelectric element used in the SMD assembly mode.

FIG. 4 illustrates a schematic view of the inclination phenomenon of the conventional photoelectric sensing element which is fastened with a circuit board.

FIG. 5 illustrates another schematic view of the inclination phenomenon of the conventional photoelectric sensing element which is fastened with the circuit board.

FIG. 6 is a plan view of a preferred embodiment of the present invention.

FIG. 7 is a side sectional view of the preferred embodiment of the present invention.

FIG. 8 is a perspective view of the preferred embodiment of the present invention as shown in FIG. 7.

DETAILED DESCRIPTION OF THE PREFERRED EMBODIMENT

Figure 1:
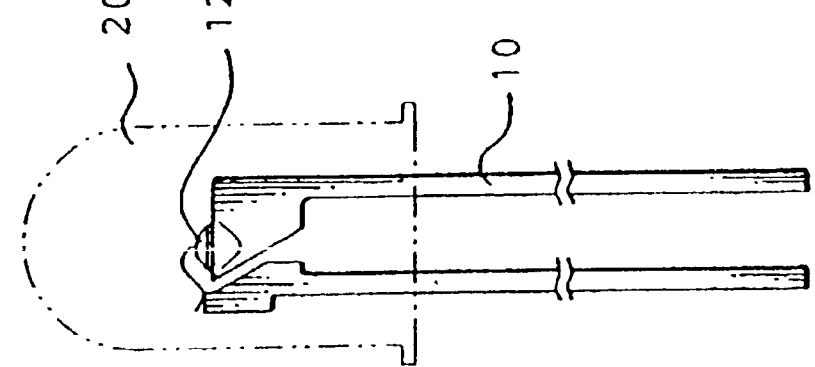
FIG. 1 illustrates a perspective view of a photoelectric sensing element of the prior art.
Figure 2:
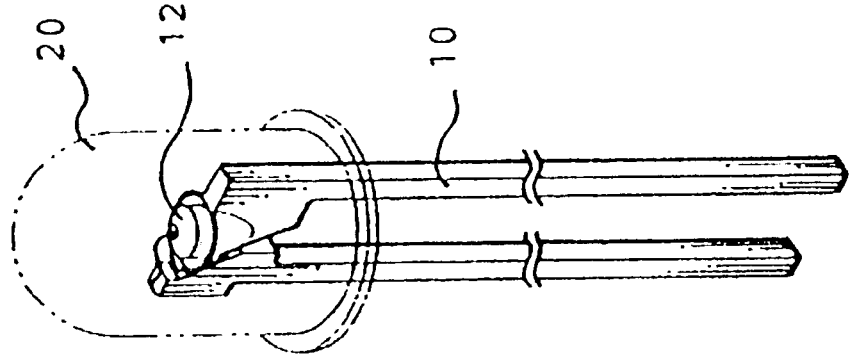
FIG. 2 illustrates a plan view of the photoelectric sensing element of the prior art as shown in FIG. 1.

As shown in FIGS. 6 to 8, the present invention provides a photoelectric structure, such as photoelectric sensing element, light emitting diode, or the like, is constructed for surface mounting on a circuit board having a plurality of insertion holes.

The photoelectric structure, such as a photoelectric sensing element, comprises a photoelectric element 10 of a disk like construction and having a pair of curved connection wires 11 extending downwards from the periphery thereof, and means for surface mounting the photoelectric element 10 on the circuit board 30.

According to the preferred embodiment of the present invention, the photoelectric element 10 comprises a disc body 101 and a chip 12 affixed on the disc body 101.

The surface mounting means comprises a pair of upright fixation pins 13 which are shielded by a sheath 20 made of an epoxy resin material or other materials by injection molding or pattern molding, so as to mount securely on a circuit board 30.

The upright fixation pins 13 are parallelly extended from a periphery of the disc body 101 downwardly from the photoelectric element 10 for directly inserting into two of the insertion holes 31 of the circuit board 30, so as to support the disc body 101 and securely mount the photoelectric element 10 on the circuit board 30, thereby an area for mounting the chip 12 of the disc body 101 is enlarged by having the two fixation pins 13 supporting the disc body 101 securely.

Thereafter, the curved connection wires 11 are fastened with the circuit board 30 by welding. Each of the bended rigid connection wires 11 has a width larger than the fixation pins 13 and is positioned between the fixation pins 13 and integrally bent in L-shaped to define a vertical upper portion 111 and a horizontal lower portion 112. A top end of the upper portion 111 of one of the connection wires 11 is positioned adjacent to the periphery of the disc body 101 for functioning as an electrode of the photoelectric element 10 while a top end of the upper portion 111 of another connection wire 11 integrally extended from the periphery of the disc body 101. The two lower portions 112 are perpendicularly extended from the upper portions 111 respectively for resting and fastening on the circuit board 30 by welding so as to electrically connect the photoelectric element 10 with the circuit board 30. Thereby, a constant height of the chip 12 and the disc body 101 positioned above the circuit board 30 is ensured by the upper portions 111 of the connection wires 11.

The photoelectric structure further comprises a sheath, made of an epoxy resin material, shielding the photoelectric element 10, the upper portions 111 of the pair of connection wires 11, and upper portions of the pair of fixation pins 13 by injection molding.

Figures 9, 10:
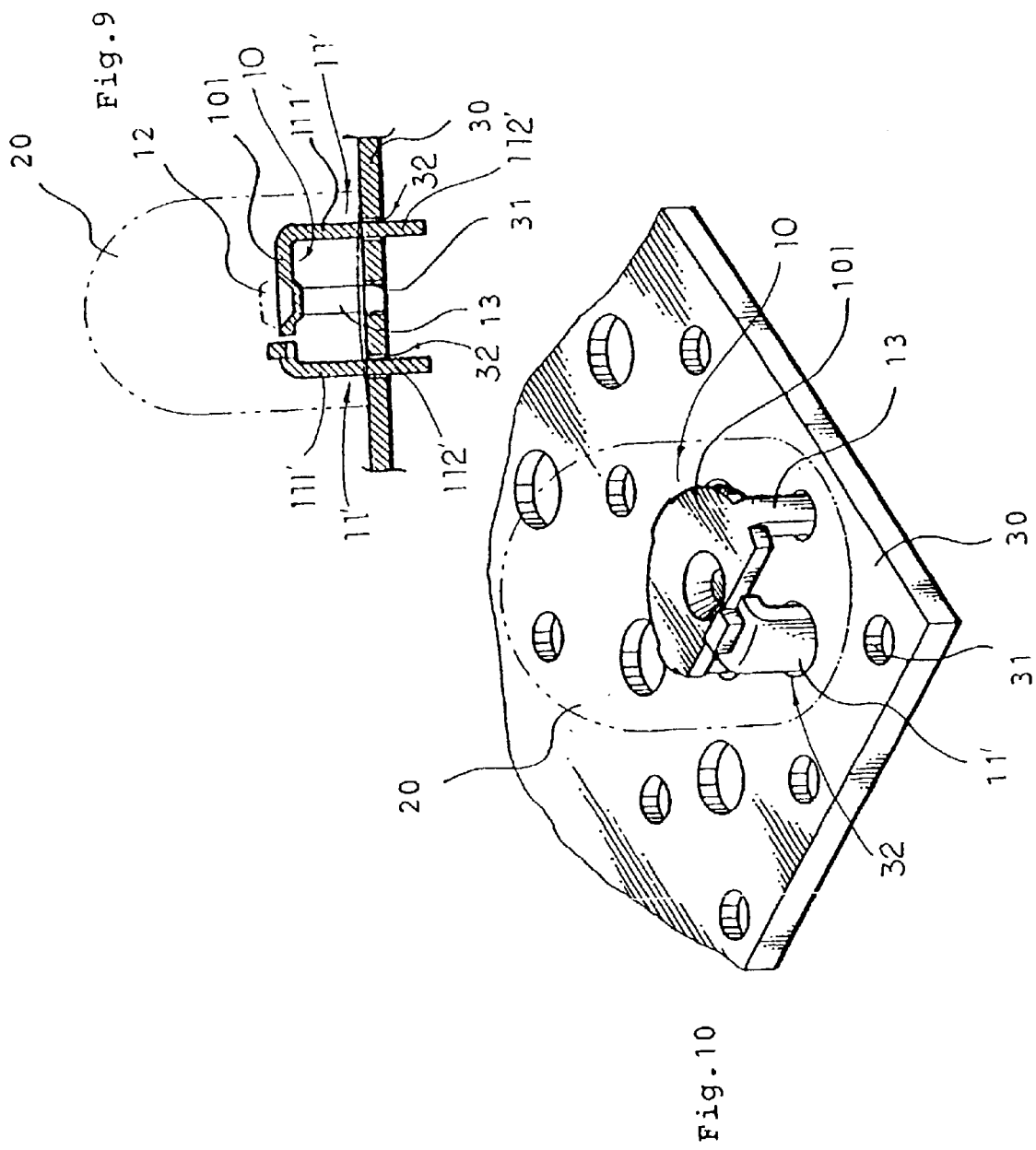
FIG. 9 is a side sectional view of another embodiment of the present invention.
FIG. 10 is a perspective view of the preferred embodiment of the present invention as shown in FIG. 9.

As shown in FIGS. 9 and 10, the connection wires 11' of the present invention are uprightly inserted into the circuit board 30 by the DIP assembly mode, thereby fastening with the fixation pins 13 for reducing the height volume requirement. In other words, each of the connection wires 11', each also having a width larger than the fixation pins 13, is downwardly extended from the periphery of the disc body 101 and positioned between the pair of fixation pins 13, wherein one of the connection wires 11' has an upper portion 111' having a top end positioned adjacent to the periphery of the disc body 101 for functioning as an electrode of the photoelectric element 10 while the another connection wire 11' has an upper portion 111' integrally extended from the periphery of the disc body 101. However, each of the connection wires 11' has a lower portion 112' downwardly extended for inserting through a respective second insertion hole 32 on the circuit board 30 and being fastened to the circuit board 30 so as to electrically connect the photoelectric element 10 with the circuit board 30.

The present invention has advantages over the prior art. The advantages of the present invention are described hereinafter.

The area of the present invention for mounting the chip is greatly enlarged such that the application scope of light emitting intensity is broadened.

The sheath covers and touches the position of the curved connection wires when the sheath is formed. As a result, the position (height) from the chip to the connection wires is very accurate so as to enhance effectively the detection of this article and the precision of the light emitting signal.

The present invention has a pair of fixation pins and a pair of connection wires, which are fastened respectively with the circuit board. The present invention can be widely used in SMD or DIP assembly mode, thereby resulting in the twofold increase in the assembly position fixation and precision of light emitting direction.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure form such principles. Therefore, this invention includes all modifications encompassed within the spirit and scope of the following claims.

What is claimed is:

1. A photoelectric structure for surface mounting on a circuit board having a plurality of insertion holes, comprising:

a photoelectric element comprising a disk body and a chip affixed on said disc body;

means for surface mounting said photoelectric element on said circuit board, comprising:

a pair of upright fixation pins parallelly extended from a periphery of said disc body downwardly for directly inserting into two of said insertion holes or said circuit board so as to support said disc body and securely mount said photoelectric element on said circuit board, thereby an area for mounting said chip of said disc body is enlarged by having said two fixation pins supporting said disc body securely, and a pair of bended rigid connection wires, having a width larger than said fixation pins, each of which is positioned between said pair of fixation pins and integrally bent in L-shaped to define a vertical upper portion and a horizontal lower portion, wherein a top end of said upper portion of one of said connection wires is positioned adjacent to said periphery of said disc body for functioning as an electrode of said photoelectric element while a top end of said upper portion of said another connection wire is integrally extended from said periphery of said disc body, wherein said two lower portions are perpendicularly extended from said upper portions respectively for resting and fastening on said circuit board by welding so as to electrically connect said photoelectric element with said circuit board, thereby a constant height of said chip and said disc body being positioned above said circuit board is ensured by said upper portions of said connection wires; and a sheath, made of an epoxy resin material, shielding said photoelectric element, said upper portions of said pair of connections, and upper portions of said pair of fixation pins by injection molding.

* * * * *